United States Patent [19]

Maury et al.

[11] Patent Number: 4,947,075

[45] Date of Patent: Aug. 7, 1990

[54] PIEZOELECTRIC INSERT WITH SIDE ELECTRIC CONNECTION CLIPS

[75] Inventors: Bernard Maury; Jean-Claude Walter; Christian Cognasse; Peter Graham, all of Bonneville, France

[73] Assignee: Horlogerie Photographique Francaise Societe anonyme, Bonneville, France

[21] Appl. No.: 327,768

[22] Filed: Mar. 23, 1989

[30] Foreign Application Priority Data

Apr. 1, 1988 [FR] France ................................ 88 04732

[51] Int. Cl.[5] ............................................ H01L 41/08

[52] U.S. Cl. .................................... 310/324; 310/330

[58] Field of Search ................................ 310/330–332, 310/348, 324; 381/190; 439/246, 249, 251, 817, 825, 822, 842, 845, 849

[56] References Cited

U.S. PATENT DOCUMENTS

| | | | |
|---|---|---|---|
| 4,035,672 | 7/1977 | Beaverson et al. | 310/324 |
| 4,230,383 | 10/1980 | Burnstein et al. | 310/324 X |
| 4,240,002 | 12/1980 | Tosi et al. | 310/324 |
| 4,295,009 | 10/1981 | Weidler | 310/324 X |
| 4,496,871 | 1/1985 | Sumita et al. | 310/324 |

OTHER PUBLICATIONS

Sounder Unit, by Baumhauer et al, Western Electric Technical Digest No. 59 (Jul. 1980), p. 1.

*Primary Examiner*—Mark O. Budd
*Attorney, Agent, or Firm*—Ratner & Prestia

[57] ABSTRACT

A piezoelectric insert is provided comprising a membrane (1) formed from a substrate (2) and two piezoelectric material layers (3, 4) whose external surfaces are metallized so as to form the electrodes (5, 6). The membrane comprises a radial excrescence (15) whose upper and lower faces are nipped between the clip shaped legs of connectors (22, 23). The electric connection of the electrodes thus requires no soldering.

5 Claims, 3 Drawing Sheets

PIEZOELECTRIC INSERT WITH SIDE ELECTRIC CONNECTION CLIPS

BACKGROUND OF THE INVENTION

1. Field of the Invention

The present invention relates to electroacoustic transducers whose vibrating element is formed of a membrane which comprises a piezoelectric layer with electrodes and is held in position at its periphery in an insert case.

2. Description of the Prior Art

This type of insert has already been known for a long time and is described for example in the patent No. FR-A-2 511 570, patent No. FR-A-2 337 480 or in the patent application No. JP-58-202699.

In known inserts, the case comprises a base body with a central cavity whose periphery forms a bearing surface for the periphery of the piezoelectric material layer membrane; the case further comprises a cover connected by its periphery to the base body with an inner recess communicating with the outside through at least one orifice; the periphery of the cover comprises an annular internal relief bearing on the membrane periphery so as to hold it applied against the periphery of the cavity of the base body.

The central cavity of the base body defines, with the piezoelectric membrane, an internal base cavity. The internal recess of the cover defines, with the piezoelectric membrane, an inner cover cavity. The piezoelectric material layer separating two conducting surfaces forming the electrodes forms an electric capacitor. The piezoelectric transducer effect causes on the electrodes an electric charge induced by the mechanical stresses undergone by the piezoelectric material layer.

In some cases, a piezoelectric membrane is used formed of a thin metal film forming the base substrate of the membrane and on which at least one piezoelectric ceramic layer is fixed. The external face of the piezoelectric ceramic is metallized, so as to form a first electrode, the substrate forming a second electrode. In other cases, the membrane is formed of a thin electrically insulating film, to which is fixed at least one piezoelectric ceramic layer, the two faces of which are metallized and form the electrodes.

The electrodes must be electrically connected to output terminals of the insert case. When the membrane comprises an electrically conducting substrate, one of the connections may be provided by a conductor soldered to the substrate. The second electrode, formed by the external metallized face of the piezoelectric material layer, is connected by a metal conductor one end of which is soldered to said metallized face.

During manufacture of such known inserts, the formation of the electric connections is a particularly delicate and expensive operation. In fact, the membranes are fragile elements, because their thickness is very small, about 100 to 200 microns. To solder such elements is difficult and requires expensive means. It must be further considered that the surface on which the conductors are to be soldered are not always easily accessible, more particularly in the case of membranes having several piezoelectric material layers. Such membranes with two piezoelectric material layers are for example described in the German patent application No. DE-A-3 309 851: a base substrate in the form of a thin metal or insulating film has, on both its faces, a piezoelectric ceramic layer whose two faces are metallized and form electrodes. The two piezoelectric elements must be connected electrically in parallel. It will be readily understood that with such a membrane structure the connections are particularly delicate to form.

An additional difficulty resides in the fact that the membrane must be held in position along its periphery by means providing sealing. The sealing is required for the correct acoustic operation of the inner base cavity and of the inner cover cavity of the insert. The Applicant has discovered that such sealing is not compatible with the passage of soldered electric conductors providing the electric connection between the electrodes and the output terminals of the insert.

Another problem met with in known inserts concerns the presence of solder for connecting the electric conductors electrically to the electrodes. The heating, required for soldering, locally degrades the piezoelectric effect in the piezoelectric material. Furthermore, the solder, as well as the conductor, increase the overall mass of the mobile membrane and lead to an appreciable loss of efficiency, and to the appearance of acoustic resonance phenomena.

The document GB-A-2 046 554 describes an electroacoustic insert with piezoelectric membrane in which the electric connections are provided without solder. In this document, the membrane substrate comprises a peripheral zone of radial excrescence, off-centered radially and projecting form the zone defined by the bearing surfaces and the seal. A conducting track, insulated by an insulating layer, connects the radial excrescence zone of the substrate to the electrode, so as to provide the electric connection. The excrescence zone extends outside the case and is intended to receive directly the external electric connection means. At the passage through the case, the radial excrescence of the substrate is embedded in the case and so is held rigidly. Such a solution avoids the use of solder but has several drawbacks, and particularly: embedment of the peripheral excrescence at its passage through the wall of the case disturbs the mechanical properties and the movements of the insert membrane, limiting the possibilities of elongation of the membrane; the external connection, between the external electric connection means and the external end of the radial excrescence, is made delicate by the fact that the radial excrescence is a fragile piece, having the same very small thickness as the rest of the membrane, so that it is not possible to provide an external electric connection using standard tags.

SUMMARY OF THE INVENTION

The object of the present invention is in particular to avoid the drawbacks of known inserts by proposing a new piezoelectric membrane insert structure in which the electric connection of the electrodes is considerably simplified, and does not disturb the mechanical operation of the useful membrane zone, i.e. the vibrating part separating the internal base cavity and the internal cover cavity.

In fact, the electric connection means, though not requiring solder, in practice do not reduce the possibilities of elongation of the membrane.

According to another object of the present invention, the connection of the electrodes is provided by a particularly reduced number of contacts between parts, and the contacts are situated inside the insert case and are thus protected from the external atmosphere.

According to another object, the internal connection is provided in accordance with the present invention without requiring any solder during fitting of the insert. The external connection may be provided by standard tags, for example tags of the "fast-on" type without risk of damaging the connecting elements. The result is that the assembly operations are considerably simplified and may be automated: automatic means may stack the elements forming the insert and simultaneously connect the electrodes, by simple movements for positioning and interfitting different components. The gain in productivity is particularly high and the risks of defects are considerably reduced.

Another object of the present invention is to provide an insert structure which makes it possible to construct a particularly flat insert, i.e. whose thickness is reduced with respect to known inserts. This advantage is obtained because the electric connections of the present invention require no soldering, so that there is no need to provide special housings for the passage of electric conductors to be inserted during assembly and to be soldered to the electrodes.

To attain these objects, as well as others, the insert of the present invention comprises a piezoelectric membrane with electrodes, for example of known type, held in position at its periphery by resilient seals providing sealing. The membrane comprises at least one off-centered zone projecting from the zone defined by the peripheral seal holding the membrane, the off-centered membrane portion defining a peripheral electric contact zone. The off-centered membrane portion, or radial excrescence, is housed inside the insert case in respective excrescences of the case portions. Conducting surface elements, insulated from each other and in contact with their corresponding electrode, connect said corresponding electrode and the radial excrescence zone together. Resilient electric conductors are held in position in the insert case and each comprises an external tongue projecting from the case and forming a connection terminal of the insert, and an internal clip shaped portion, the external tongue and the internal portion being fast with each other and joined together by a portion passing through the wall of the case. The resilient electric conductors form connectors and are respectively in contact with the corresponding end of a respective conducting surface element, for providing the electric connection of the electrodes. The clip shaped portions of the resilient electric conductors are held in abutment on each side of the membrane and provide the electric connection between the electrodes and the output terminals of the insert.

In one embodiment, the clip shaped resilient electric conductors apply a controlled contact pressure on each side of the piezoelectric membrane, the legs of the clip being compressed together respectively by the base body and cover of the insert case during assembly thereof. The result is that the undesirable influence of possible prestresses or initial deformations of the clip legs are very substantially reduced: the bearing force of the clip legs on the electrodes is in fact mainly determined by the case when the insert is entirely formed.

BRIEF DESCRIPTION OF THE DRAWINGS

Other objects, characteristics and advantages of the present invention will be clear from the following description of particular embodiments with reference to the accompanying figures in which.

DESCRIPTION OF THE PREFERRED EMBODIMENTS

Figure 1:
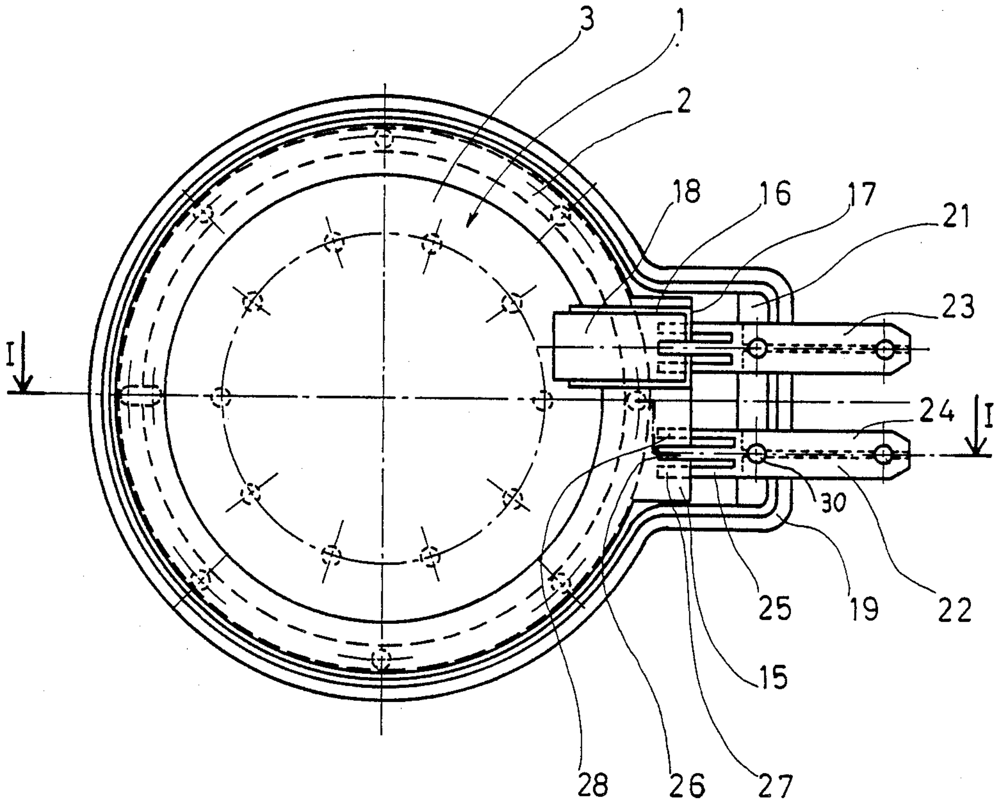
FIG. 1 is a top view of an insert in a first embodiment of the present invention, with the cover removed.

In the embodiment shown in the figures, the insert of the present invention comprises a piezoelectric membrane 1. The invention applies for example to a piezoelectric membrane 1 formed of a single layer of piezoelectric material fast with a substrate. The present invention also applies to a dimorphous piezoelectric membrane 1, i.e. in which a substrate supports two piezoelectric material layers. The embodiment shown in the figures relates to such a dimorphous membrane, formed of a central substrate 2, made from an electrically conducting material, whose upper face and lower face carry respectively an upper piezoelectric ceramic layer 3 and a lower piezoelectric ceramic layer 4. The upper face 5 of the upper piezoelectric ceramic layer 3 is itself metallized so as to form a first electrode. The lower face 6 of the lower piezoelectric ceramic layer 4 is also metallized so as to form a second electrode. Substrate 2 forms a central electrode common to the two piezoelectric ceramic layers.

Substrate 2 forms substantially a circular disk: the upper 3 and lower 4 piezoelectric ceramic layers are also substantially circular and have a radius less than the radius of the disk forming substrate 2, and are centered with respect to substrate 2.

The membrane is inserted in a case formed of two main parts: a base body 7 and a cover 8. The base body 7 has a central cavity 9 whose periphery, in the form of a peripheral annular relief 10, forms a bearing surface for the periphery of substrate 2. The lower edge of substrate 2 rests on the annular peripheral relief 10.

The cover 8 comprises an inner recess 11, communicating with the outside through a series of orifices such as orifice 12, spaced evenly apart in the wall of the cover, as shown in the figures. The cover recess 11 defines an internal cover cavity. The central cavity 9 of the base body defines and internal base body cavity. The internal cavities are separated from each other by the piezoelectric membrane 1.

The periphery of cover 8 comprises an internal annular relief 13 bearing on the periphery of substrate 2. In the embodiment shown, the annular relief 13 is formed of an internal resilient O-seal made from elastomer. Cover 8 is connected by its periphery 14 to the base body 7. Cover 8 and base body 7 may be fixed together, during assembly of the insert, by any means such as soldering, bonding, force fitting, or others.

In the embodiment shown in the figures, the lower 10 and upper 13 peripheral annular reliefs hold the substrate 2, by nipping, outside the zone occupied by the lower 4 and upper 3 piezoelectric ceramic layers.

Substrate 2 comprises over a portion of its periphery, a radial excrescence 15 forming an accessible zone of substrate 2 outside the limits defined by the internal cover relief 13 and the annular peripheral relief 10 of the base body 7. Excrescence 15 thus forms a zone on which an electric contact with substrate 2 may be provided without disturbing the mechanical characteristics of the central membrane portion or portion situated inside the limits defined by reliefs 10 and 13 of the case. For example, the radial excrescence 15 forms, from the circular edge defined by the internal 13 and annular 10 reliefs, a rectangular strip as shown in FIG. 1.

A strip of electrically insulating varnish 16 partially covers the radial excrescence 15 and forms a continuous insulating zone between edge 17 of excrescence 15 and the upper face 5 of the upper piezoelectric ceramic layer 3. A track 18 made from an electrically conducting material is formed on the strip of varnish 16. Track 18 projects from the insulating varnish strip 16 to partially cover the upper face 5 of the upper piezoelectric ceramic layer 3, so that the conducting track 18 is connected electrically to the electrode formed by the upper metallized face 5. Track 18 extends as far as the vicinity of the edge 17 of the radial excrescence 15, but is totally insulated from substrate 2 by the insulating varnish strip 16.

In the embodiments in which membrane 1 only comprises a single piezoelectric ceramic layer, a single track 18 and at least one insulating varnish strip 16 are sufficient to provide the connection of the external metallized piezoelectric ceramic face 5.

In the embodiments in which the membrane 1 is of dimorphous type, such a varnish strip 160 must then be used on the lower surface of the membrane and such a track 180 also on the lower face of the strip of varnish 160. In this case, preferably, the respective upper 18 and lower 180 tracks are disposed symmetrically on each side of membrane 1 so that they are superimposed on each other looking down at FIG. 1. Thus it will be readily understood that, seen from below, membrane 1 as well as the lower tracks 180 and strips of varnish 160 have the same appearance as tracks 18 and strips 16 seen from above in FIG. 1.

The radial excrescence 15 of substrate 2 is housed in respective corresponding excrescences 19 of base body 7 and 20 of cover 8. The excrescences 19 and 20 define a peripheral compartment 21 inside the case but outside the vibration zone defined by the peripheral annular relief 10 of the base body and the internal cover relief 13, the peripheral compartment 21 being intended to receive the means providing the electric connection between the connection terminals of the insert and the membrane.

In the embodiment shown in the figures, the electric connection is provided by two metal connectors 22 and 23 in the form of a clip. Connectors 22 and 23 have an identical shape. Thus, connector 22 comprises an external tongue 24, projecting outside the case, integral with an internal portion 25 housed in the peripheral compartment 21 and to which it is connected by a portion passing through the wall of the case. The internal portion 25 is cut out so as to form a fork with three prongs, a central prong 26 offset upwards so as to form an upper clip leg and two lateral prongs 27 and 28 offset downwards so as to form the lower clip leg, as shown in the figures. Starting from the connection zone to the external tongue 24, each prong comprises a portion moving further away from the plane formed by said external tongue 24, then an end portion curved in the other direction and drawing closer to the plane formed by said external tongue. Each end portion comprises a portion shaped so as to form a bearing point on a surface and electric contact with said surface. Connectors 22 and 23 are held in position in the case for example by means of studs 29 in the cover engaging in a corresponding holes 30 of connector 22. The connectors are also held in position by being nipped between the base body 7 and cover 8.

When the insert is assembled, the central prong 26 of connector 22 bears by its bearing point on the upper face of substrate 2, in its radial excrescence zone 15 whereas the lower prongs 27 and 28 of connector 22 bear by their bearing points on the lower face of substrate 2 in its zone 15. Thus, connector 22 forms, by its external tongue 24, a connection terminal of the insert connected to the central electrode formed by the substrate 2.

Similarly, the central prong of connector 23 bears by its bearing point on the upper face of the upper conducting track 18, whereas the lateral prongs of connector 23 bear by their bearing points on the lower conducting track 180 of the membrane. The result is that the upper electrode or upper metallized face 5 is connected electrically to the lower electrode or lower metallized face 6 of the membrane by the upper conducting track 18, by the central and lateral prongs of connector 23 and by the lower conducting track 180. Furthermore, connector 23 forms, by its external tongue, an output terminal of the insert connected simultaneously to the upper 5 and lower 6 electrodes of membrane 1.

Figure 3:
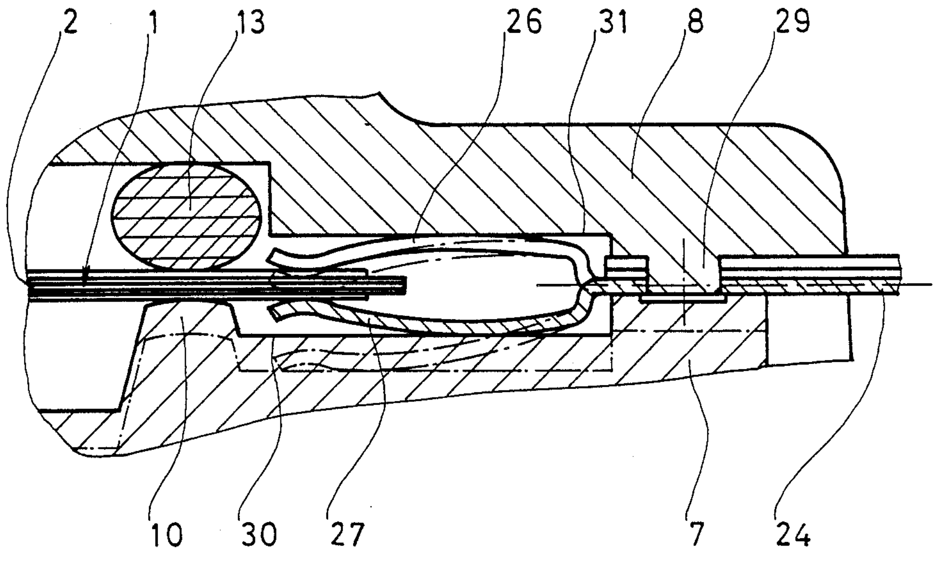
FIG. 3 is a partial view of FIG. 2, on a large scale, in the zone of the contact clip.

Preferably, legs 26, 27 and 28 of connectors 22 and 23 are actuated by the base body 7 and cover 8 during assembly of the insert. In FIG. 3, the shape of the device has been shown, by broken lines, when the cover is not yet fitted to the base body 7: the legs of the clip formed by prongs 26, 27 and 28 of connector 24 are spaced relatively far apart, thus facilitating insertion of membrane 1 between the legs. After such insertion, when the cover 8 is fitted to the base body 7, external base body 7 comprises an upper face 30 bearing on the lower prongs 27 and 28 of connectors 24 and 23, whereas the cover 8 comprises a lower face 31 also bearing on the upper prong 26 of the connectors. The combined action of faces 30 and 31 produces tightening of the clip formed by prongs 26, 27 and 28, and controls clamping of the clip on membrane 1.

Preferably, the upper 26 and lower 27 and 28 prongs of connectors 23 and 24 are shaped so that, when the case is closed by fitting cover 8 on the base body 7, the forces applied by the clip on the upper face and on the lower face of the membrane are balanced. Thus, the presence of connectors 23 and 24 introduces no disturbances in the mechanical and acoustic operation of membrane 1.

The conducting tracks 18 and 180 may be formed by silk screen printing of an electrically conducting material paste. Tracks 18 and 180 may however be formed by any other means well known in the technique.

An alternative may consist in providing piezoelectric ceramic layers 3 and 4 themselves comprising metallized excrescences in the zone 15 of the substrate 2. Thus, the electric connection may be direct between connector 23 and electrodes 5 and 6.

In the embodiments shown, the assembly of connections is provided in a single peripheral radial excrescence 15. Alternately, embodiments may be preferred in which the connections are formed in two or more separate peripheral radial excrescence zones.

Figure 2:
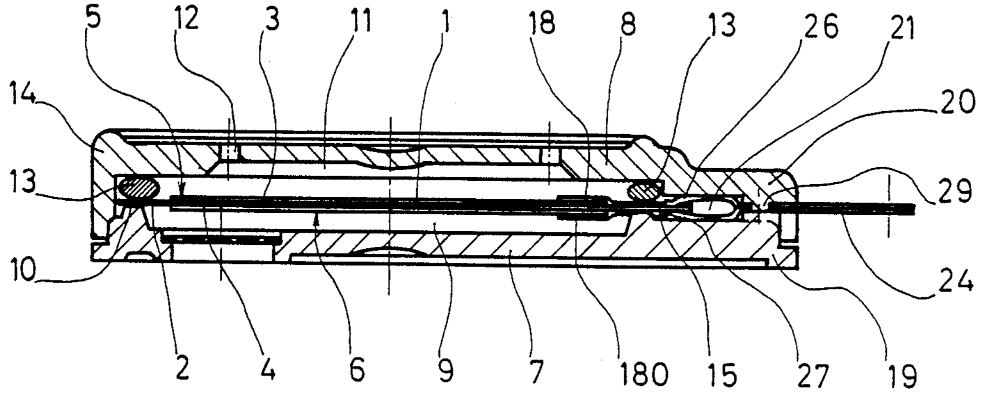
FIG. 2 is a side view in section through line I—I of FIG. 1.

In the embodiment shown in FIGS. 1 to 3, connectors 22 and 23 are disposed in a radial direction, in the extension of the radial excrescence 15 of the membrane. This embodiment has the advantage of positioning the two connectors 22 and 23 in two parallel directions, for example on each side of the axis of symmetry of the insert, as shown in the figures and in the plane of the membrane. Such an embodiment may be preferred in the case where it is desired to provide a plug-in insert, connectors 22 and 23 then being engaged in external female connectors by axial translational movement.

Figure 4:
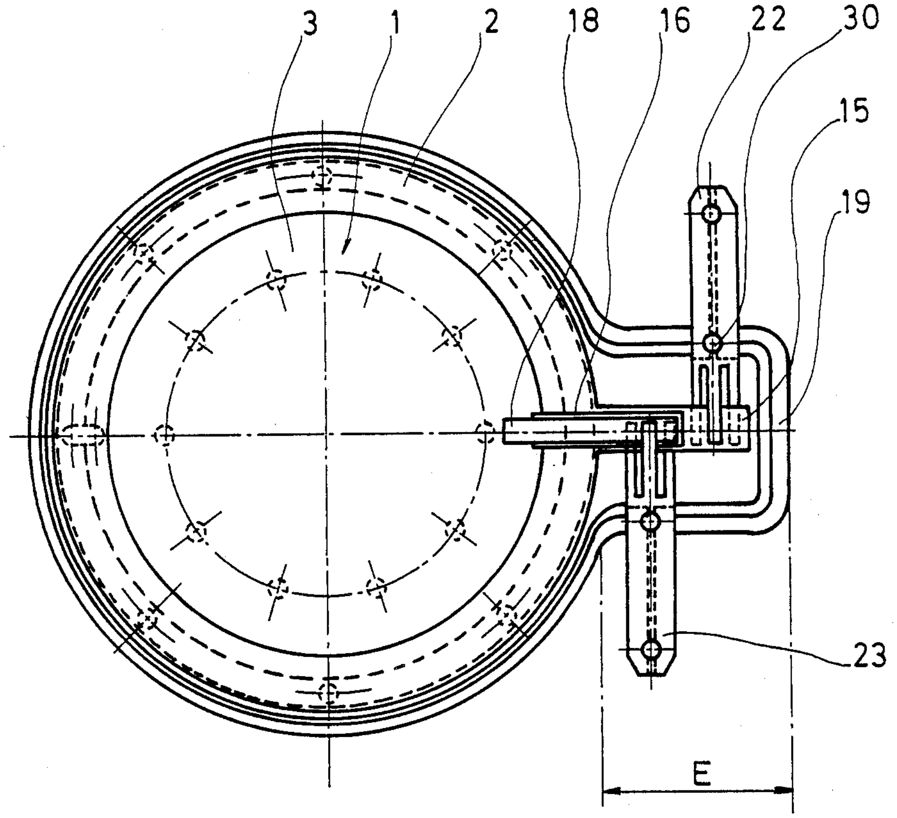
FIG. 4 is a top view of an insert in a second embodiment of the present invention, with the cover removed.

In the embodiment shown in FIG. 4, connectors 22 and 23 are perpendicular to the radial direction of development of the radial excrescence 15. In the figure, connectors 22 and 23 have been shown in head to tail positions, connector 22 being developed in a first direction perpendicular to the radial direction of excrescence 15, whereas connector 23 develops in the opposite direction, the two connectors being again in the plane of the membrane. Connectors 22 and 23 of FIG. 4 have substantially the same construction as connectors 22 and 23 of FIG. 1. However, it will be understood that the tangential arrangement of connectors 22 and 23 of FIG. 4 reduces the radial space required by the connection means of the insert. The size of the connectors develops in a tangential direction, so that it is possible, without increasing the total size of the insert, to increase the length of the connectors and, in particular, the length of the prongs of each connector. The increase in length of the prongs, not shown in FIG. 4, makes it possible to increase the length of the resilient portion of the connectors, without increasing the radial size E of the insert excrescence, which is favorable to the correct control and reliability of the electric contacts of the connectors on the membrane.

In the embodiments in which the membrane is of dimorphous type, the upper and lower legs of the connectors advantageously have identical lengths, as shown in the figure. In the case of a membrane formed of a single layer of piezoelectric material on a substrate, connectors may on the other hand be used whose upper and lower legs have different lengths, the long leg serving for contact with the piezoelectric material, while the shorter leg serves for contact with the substrate.

The present invention is not limited to the embodiments which have been explicitly described, but includes the different variants and generalizations thereof contained in the scope of the following claims.

What is claimed is:

1. Electroacoustic insert with piezoelectric membrane, whose vibrating element is formed of a membrane which has a piezoelectric material layer with electrodes and is held in position at its periphery in an insert case, the case comprising a base body with a central cavity whose periphery forms a bearing surface for the membrane periphery, the case further comprising a cover connected by its periphery to the base body with an internal recess communicating with the outside through at least one orifice, the periphery of the cover comprising an inner annular relief bearing on the membrane periphery and holding it applied against the periphery of the cavity of the base body, electric conductors providing the electric connection between the electrodes of the membrane and output terminals of the insert, the membrane comprising at least one peripheral radial excrescence zone, off-centered radially and projecting from the zone defined by the bearing surfaces of the membrane in the insert case, surface conducting elements insulated from each other and in contact with their corresponding electrode connecting their corresponding electrode and said radial excrescence together, wherein:

said radial excrescence is housed inside the case in respective excrescences of the case portions, at least two clip shaped connectors each comprising at least one upper leg and at least one lower leg, are in resilient abutment with their upper leg bearing on the upper face of said membrane and with their lower leg bearing on the lower face of said membrane, in the radial excrescence zone of the membrane, said connectors being respectively in contact with the corresponding end of respective conducting surface elements for providing electric connection of the electrodes, said connectors are held in position in the case and each comprises an external tongue forming a terminal for connection of the insert and an internal portion in the form of a clip, wherein the clips of the connectors are urged by the insert case, the case body and the cover tending to close up the clip legs towards each other during assembly of the insert.

2. Insert as claimed in claim 1, wherein said conducting surface elements are formed by silk screen printing of an electrically conducting material paste.

3. Electroacoustic insert with piezoelectric membrane, whose vibrating element is formed of a membrane which has a piezoelectric material layer with electrodes and is held in position at its periphery in an insert case, the case comprising a base body with a central cavity whose periphery forms a bearing surface for the membrane periphery, the case further comprising a cover connected by its periphery to the base body with an internal recess communicating with the outside through at least one orifice, the periphery of the cover comprising an inner annular relief bearing on the membrane periphery and holding it applied against the periphery of the cavity of the base body, electric conductors providing the electric connection between the electrodes of the membrane and output terminals of the insert, the membrane comprising at least one peripheral radial excrescence zone, off-centered radially and projecting from the zone defined by the bearing surfaces of the membrane in the insert case, surface conducting elements insulated from each other and in contact with their corresponding electrode connecting their corresponding electrode and said radial excrescence together, wherein:

said radial excrescence is housed inside the case in respective excrescences of the case portions, at least two clip shaped connectors each comprising at least one upper leg and at least one lower leg, are in resilient abutment with their upper leg bearing on the upper face of said membrane and with their lower leg bearing on the lower face of said membrane, in the radial excrescence zone of the membrane, said connectors being respectively in contact with the corresponding end of respective conducting surface elements for providing electric connection of the electrodes, said connectors are held in position in the case and each comprises an external tongue forming a terminal for connection of the insert and an internal portion in the form of a clip, wherein the piezoelectric ceramic layers themselves comprise excrescences, metallized in the radial excrescence zone of said membrane and a connecting clip bears directly on said radial excrescences of the electrodes.

4. Electroacoustic insert with piezoelectric membrane, whose vibrating element is formed of a membrane which has a piezoelectric material layer with electrodes and is held in position at its periphery in an insert case, the case comprising a base body with a central cavity whose periphery forms a bearing surface for the membrane periphery, the case further comprising a cover connected by its periphery to the base body with an internal recess communicating with the outside through at least one orifice, the periphery of the cover comprising an inner annular relief bearing on the membrane periphery and holding it applied against the periphery of the cavity of the base body, electric conductors providing the electric connection between the electrodes of the membrane and output terminals of the insert, the membrane comprising at least one peripheral radial excrescence zone, off-centered radially and projecting from the zone defined by the bearing surfaces of the membrane in the insert case, surface conducting elements insulated from each other and in contact with their corresponding electrode connecting their corresponding electrode and said radial excrescence together, wherein:

said radial excrescence is housed inside the case in respective excrescences of the case portions, at least two clip shaped connectors each comprising at least one upper leg and at least one lower leg, are in resilient abutment with their upper leg bearing on the upper face of said membrane and with their lower leg bearing on the lower face of said membrane, in the radial excrescence zone of the membrane, said connectors being respectively in contact with the corresponding end of respective conducting surface elements for providing electric connection of the electrodes, said connectors are held in position in the case and each comprises an external tongue forming a terminal for connection of the insert and an internal portion in the form of a clip, wherein, when the case is closed, the clips of said connectors have bearing forces balanced on each side of the plane of the membrane.

5. Electroacoustic insert with piezoelectric membrane, whose vibrating element is formed of a membrane which has a piezoelectric material layer with electrodes and is held in position at its periphery in an insert case, the case comprising a base body with a central cavity whose periphery forms a bearing surface for the membrane periphery, the case further comprising a cover connected by its periphery to the base body with an internal recess communicating with the outside through at least one orifice, the periphery of the cover comprising an inner annular relief bearing on the membrane periphery and holding it applied against the periphery of the cavity of the base body, electric conductors providing the electric connection between the electrodes of the membrane and output terminals of the insert, the membrane comprising at least one peripheral radial excrescence zone, off-centered radially and projecting from the zone defined by the bearing surfaces of the membrane in the insert case, surface conducting elements insulated from each other and in contact with their corresponding electrode connecting their corresponding electrode and said radial excrescence together, wherein:

said radial excrescence is housed inside the case in respective excrescences of the case portions, at least two clip shaped connectors each comprising at least one upper leg and at least one lower leg, are in resilient abutment with their upper leg bearing on the upper face of said membrane and with their lower leg bearing on the lower face of said membrane, in the radial excrescence zone of the membrane, said connectors being respectively in contact with the corresponding end of respective conducting surface elements for providing electric connection of the electrodes, said connectors are held in position in the case and each comprises an external tongue forming a terminal for connection of the insert and an internal portion in the form of a clip, wherein said connector clips each comprise three prongs, a first prong forming one of the clip legs, the other prongs forming the second clip leg.

* * * * *